(12) United States Patent
Shiota et al.

(10) Patent No.: US 7,514,349 B2
(45) Date of Patent: Apr. 7, 2009

(54) SEMICONDUCTOR OPTICAL DEVICE AND MANUFACTURING METHOD THEREOF

(75) Inventors: Takashi Shiota, Sagamihara (JP); Tomonobu Tsuchiya, Hachioji (JP)

(73) Assignee: Opnext Japan, Inc., Yokohama-shi (JP)

( * ) Notice: Subject to any disclaimer, the term of this patent is extended or adjusted under 35 U.S.C. 154(b) by 0 days.

(21) Appl. No.: 11/505,293

(22) Filed: Aug. 17, 2006

(65) Prior Publication Data

US 2007/0291809 A1    Dec. 20, 2007

(30) Foreign Application Priority Data

Jun. 19, 2006    (JP)    ............................. 2006-168827

(51) Int. Cl.
*H01L 21/28* (2006.01)
(52) U.S. Cl. .................. 438/604; 438/605; 438/48; 257/76; 257/201; 257/E33.024
(58) Field of Classification Search ........................ None
See application file for complete search history.

(56) References Cited

U.S. PATENT DOCUMENTS 4,227,975 A * 10/1980 Hartman et al. ............. 438/604

OTHER PUBLICATIONS

Kurihara et al., Journal of Crystal Growth, 254, 2003, pp. 6-13.*
Journal of Crystal Growth, 254 2003, pp. 6 to 13.
Journal of Crystal Growth, 271, 2004, pp. 341 to 347.

* cited by examiner

*Primary Examiner*—A. Sefer
*Assistant Examiner*—Scott R Wilson
(74) *Attorney, Agent, or Firm*—Antonelli, Terry, Stout & Kraus, LLP.

(57) ABSTRACT

The object of the invention is to reduce the deterioration of crystallinity in the vicinity of an active layer when C, which is a p-type dopant, is doped and to suppress the diffusion of Zn, which is a p-type dopant, into an undoped active layer, thus to realize a sharp doping profile. When a Zn-doped InGaAlAs layer having favorable crystallinity is provided between a C-doped InGaAlAs upper-side guiding layer and an undoped active layer, the influence of the C-doped InGaAlAs layer whose crystallinity is lowered can be reduced in the vicinity of the active layer. Further, the Zn diffusion from a Zn-doped InP cladding layer can be suppressed by the C-doped InGaAlAs layer.

5 Claims, 8 Drawing Sheets

- InP
- Si-InGaAlAs (690°C)
- GROWTH INTERRUPTION (5 MINUTES)
- C-InGaAlAs (535°C)
- InP

FIG.6

InAlAs (Al : 0.48)

InGaAlAs (Al : 0.25)

InGaAs

TABLE 1

| Zn CARRIER CONCENTRATION IN THE UPPER PART OF ACTIVE LAYER | RESISTANCE (85°C) | THRESHOLD CURRENT VALUE (85°C) |
|---|---|---|
| UNDOPED | 7.7 Ω | 13.3mA |
| $8 \times 10^{17}$ cm$^{-3}$ | 4.9 Ω | 17.4mA |

FIG.14

TABLE 2

| SPECIFICATION | THRESHOLD CURRENT VALUE (25°C) |
|---|---|
| Zn-InGaAlAs -based compounds | 11.5mA |
| C-InGaAlAs -based compounds | 14.7mA |

FIG.15

TABLE 3

| COMPOSITION | SURFACE MORPHOLOGY |
|---|---|
| InAlAs (Al : 0.48) | MIRROR SURFACE |
| InGaAlAs (Al : 0.25) | PIT |
| InGaAs | MILKY |

SEMICONDUCTOR OPTICAL DEVICE AND MANUFACTURING METHOD THEREOF

PRIORITY OF CLAIMS

The present application claims priority from Japanese application JP2006-168827, filed on Jun. 19, 2006, the content of which is hereby incorporated by reference into this application.

BACKGROUND OF THE INVENTION

1. Field of the invention

The present invention relates to semiconductor optical devices and a manufacturing method thereof, and more particularly to a technique which is effectively applicable to the structure of a p-type semiconductor layer of a semiconductor optical device including a semiconductor laser, and a method for forming the p-type semiconductor layer.

2. Description of the Related Arts

Figure 1:
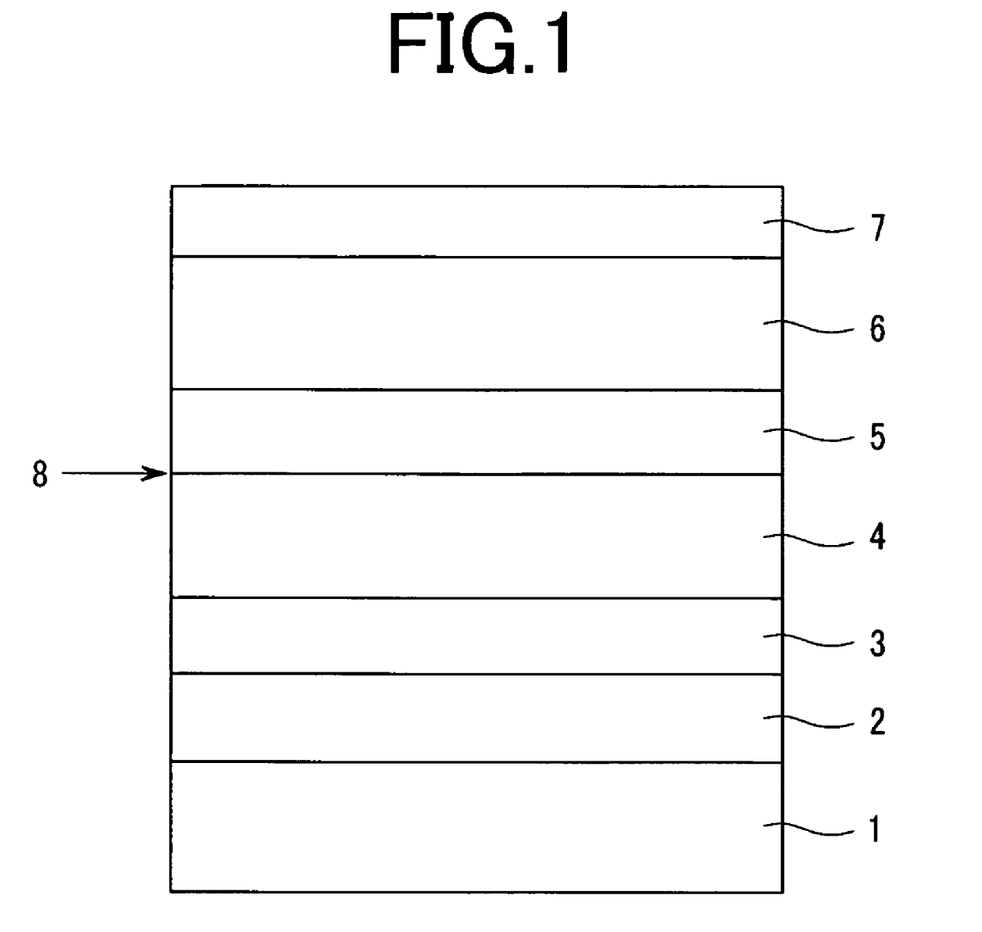
FIG. 1 is a schematic view showing the cross-sectional structure of a conventional semiconductor multi-layered film.
Figure 2:
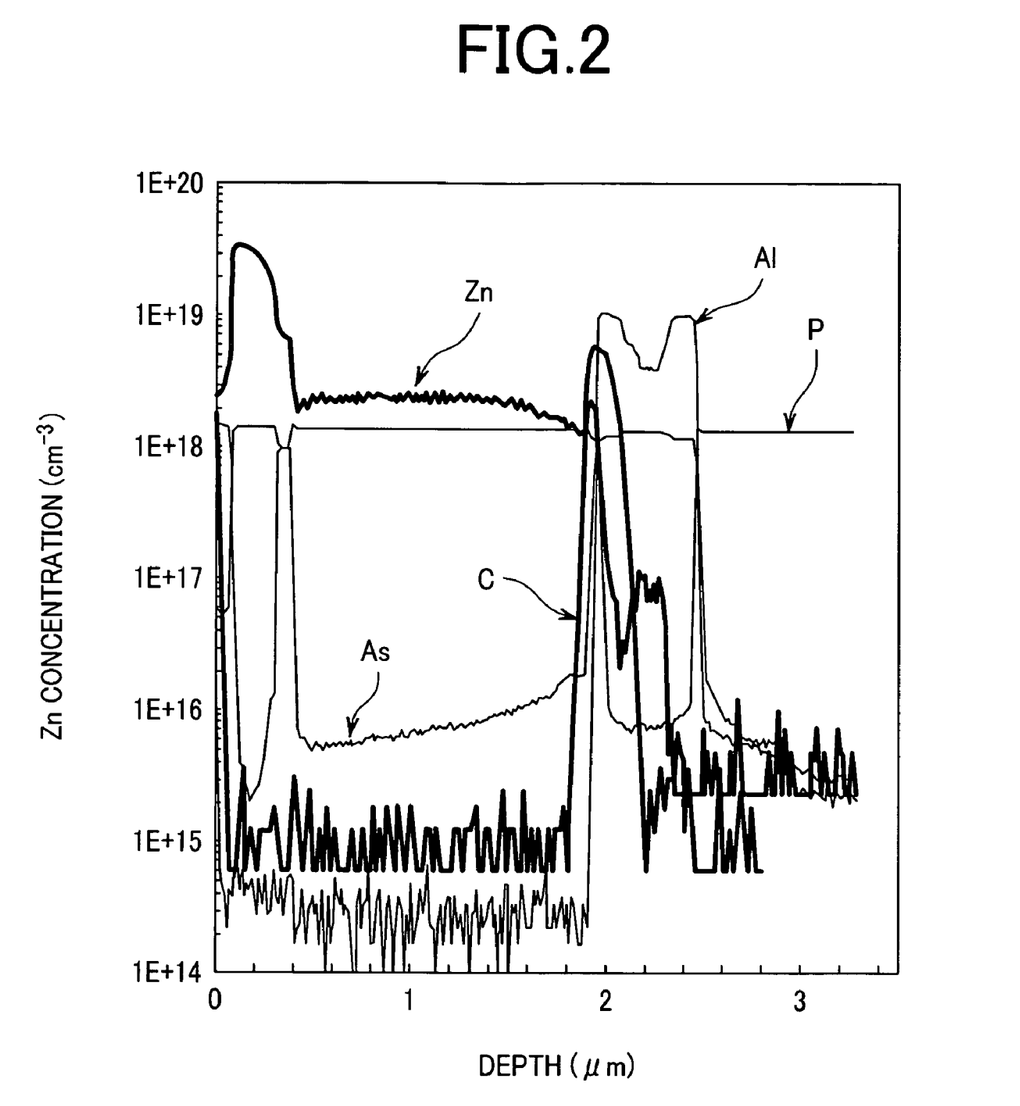
FIG. 2 is a view showing an example of profiles of C and Zn in a conventional C-doped semiconductor multi-layered film.
Figure 3:
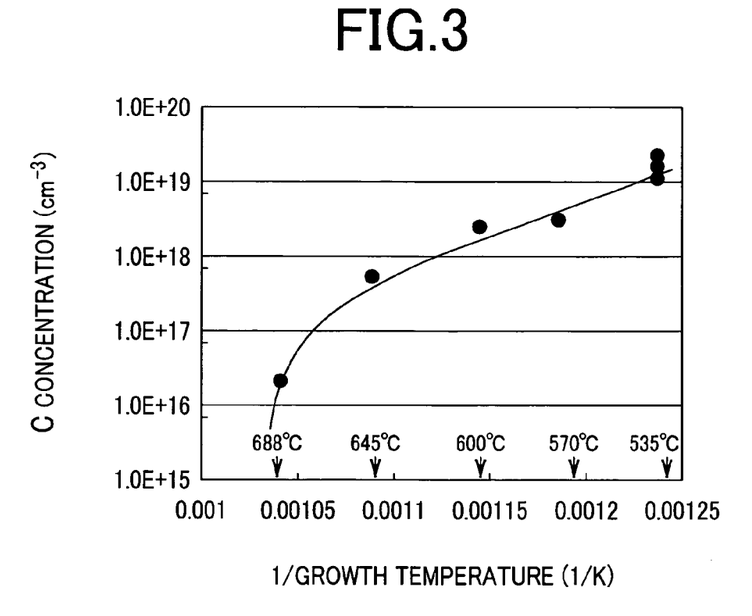
FIG. 3 is a graph showing the relationship between a growth temperature and the concentration of C.
Figure 4:
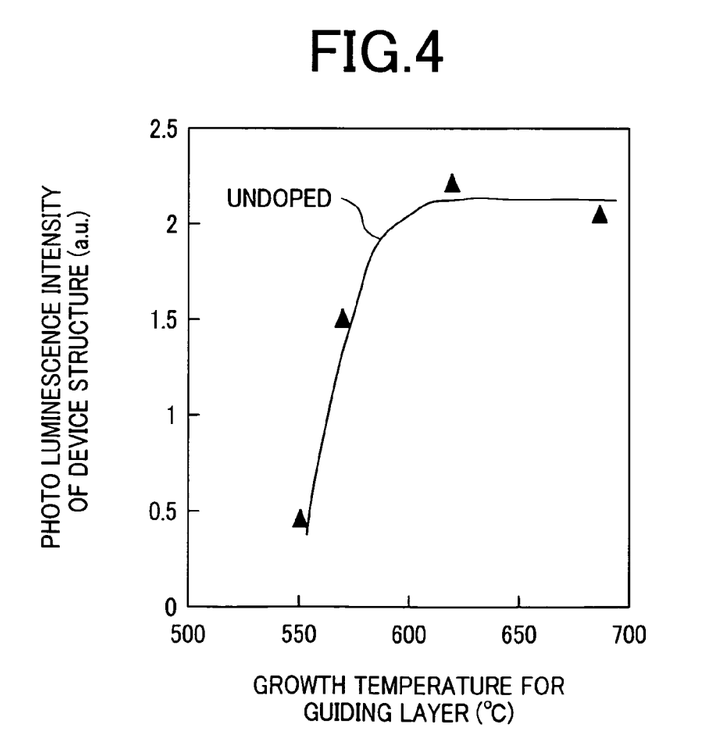
FIG. 4 is a graph showing the relationship between a growth temperature of a guiding layer and a PL intensity of the device structure.
Figure 13:
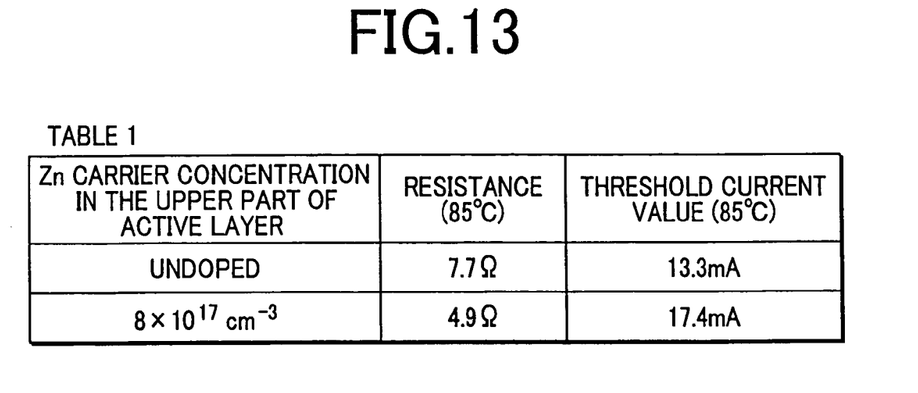
FIG. 13 is a table showing a comparison of device characteristic with respect to the doping concentration.

As a method of crystal growth on an InP substrate for a semiconductor laser, a metalorganic vapor phase epitaxy has been mainly used. Zn is used as a p-type dopant, which is produced from DEZn or DMZn, and Si or Se is used as an n-type dopant, which are produced from $Si_2H_6$ or $H_2Se$. Although Si and Se used as the n-type dopants hardly diffuse, Zn used as the p-type dopant easily diffuses. Accordingly, for example, when the concentration of Zn of a p-type guiding layer or a p-type buried layer is increased, the laser characteristic is enhanced up to a certain concentration of Zn along with the increase of the concentration of Zn. However, when the concentration of Zn becomes excessively high, Zn diffuses into an undoped active layer and hence, the laser characteristic is sharply deteriorated. FIG. 13 shows a result of an experiment on Zn characteristic by actually preparing laser devices. When the concentration of Zn was increased to $8 \times 10^{17}$ cm$^{-3}$ from an undoped state, a threshold current value was increased by 4.1 mA although the resistance was lowered by 2.8 Ω. Further, as the p-type dopant having a low diffusion constant compared to Zn, C (carbon) is known, which is produced from $CBr_4$, $CCl_4$ or the like. Although C is used as the p-type dopant with respect to InGaAs, InGaAlAs and InAlAS, C becomes the n-type dopant with a low doping concentration with respect to InP and InGaAsP. FIG. 1 is a schematic cross-sectional view of the device structure when C is used. The device structure is formed by successively laminating an n-Inp cladding layer 2, an n-InGaAlAs lower-side guiding layer 3, an undoped InGaAlAs multiple quantum well active layer 4, a C-doped InGaAlAs upper-side guiding layer 5, a Zn-doped InP cladding layer ($1 \times 10^{18}$ cm$^{-3}$) 6, a Zn-doped InGaAs contact layer 7 on an n-InP substrate 1. Profiles of C and Zn in the device structure are shown in FIG. 2. It was confirmed that the Zn diffusion from the cladding layer was stopped at the C-doped layer and Zn did not diffuse into the undoped active layer. When C is doped with a high doping concentration, it is necessary to allow C to grow at a low temperature of 600° C. or less and at a low V/III ratio (a flow rate ratio of V group/III group) (for example, see the relationship between the concentration of C and a growth temperature shown in FIG. 3). Thus, the crystallinity of the InGaAlAs upper-side guiding layer 5 is deteriorated. FIG. 4 shows the relationship between the growth temperature of the InGaAlAs upper-side guiding layer 5 and a PL (photo luminescence) intensity of the device structure. As can be understood from FIG. 3 and FIG. 4, to perform doping of C with the C concentration of $1 \times 10^{18}$ cm$^{-3}$ or more, it is necessary to set the growth temperature to 600° C. or less. (see K. Kurihara et. al., "Carbon-doped InAs(Ga)As with low oxygen contamination", Journal of Crystal Growth, 254, 2003, pages 6 to 13). On the other hand, the PL intensity of the device structure is sharply lowered when the growth temperature of the upper-side guiding layer 5 is set to 600° C. or less and the crystallinity of the InGaAlAs upper-side guiding layer is deteriorated in the low-temperature growth of 600° C. or less. Hence, it is considered that the PL intensity of a light emitting layer is lowered due to the lack of crystallinity.

Figure 5:
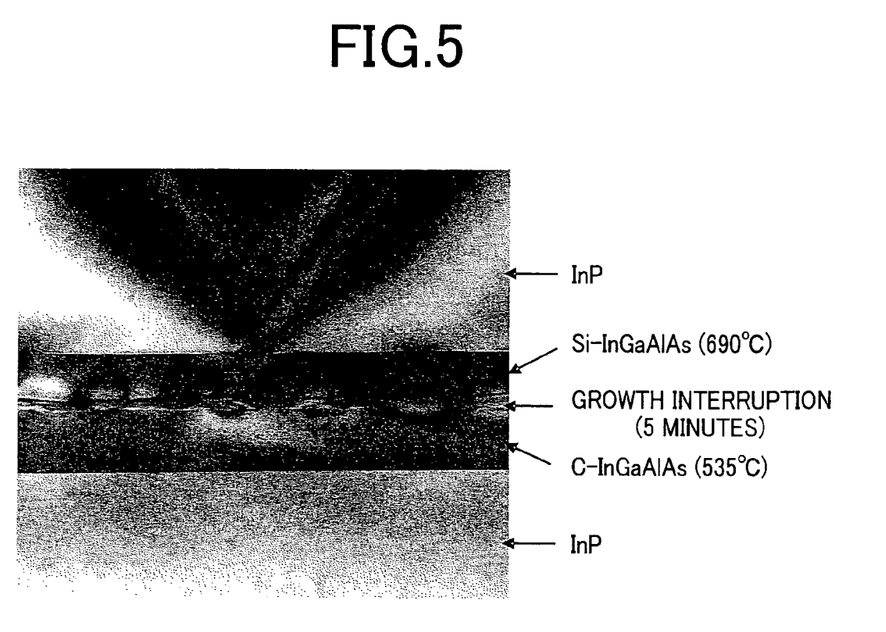
FIG. 5 is a cross-sectional transmission electron microscope figure at the time of growth interruption.

Further, while the usual InGaAlAs layer is grown in the vicinity of 700° C., the C-doped layer is grown at a temperature of 600° C. or less and hence, the growth interruption becomes necessary when the temperature rises or lowers. Accordingly, for example, the crystallinity at an interface between the undoped InGaAlAs multiple quantum well active layer 4 and the C-doped InGaAlAs upper-side guiding layer 5 is deteriorated by the growth interruption (K. Kurihara et. al., "Phase separation in InAlAs grown by MOVPE with a low growth temperature", Journal of Crystal Growth, 271, 2004, pages 341 to 347). FIG. 5 is a Transmission Electron Microscope figure which is obtained as a result of study of the deterioration of crystallinity due to the growth interruption. In this study, to clearly observe the influence of the growth interruption, after growing the C-doped InGaAlAs layer at a growth temperature of 535° C., the growth interruption in the hydrogen atmosphere was provided for 5 minutes for temperature elevation and temperature stabilization, and the InGaAlAs layer was grown at a temperature of 690° C. As a result, it was confirmed that a crystalline defect was generated at an interface where the growth interruption was provided.

Figure 14:
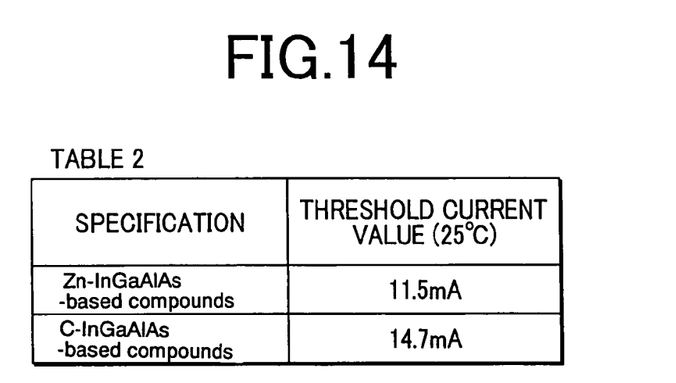
FIG. 14 is a table showing a comparison of a threshold current value with respect to a dopant.

FIG. 14 shows a result of an experiment on characteristics by actually preparing laser devices. In spite of the fact that the diffusion of Zn from the cladding layer was stopped at the C-doped layer, a threshold current value was increased by 3.2 mA. The above-mentioned results (FIG. 2 to FIG. 5, and FIG. 14) indicate that although the diffusion of Zn to the active layer can be suppressed by the C-doped InGaAlAs layer, the crystallinity in the growth layer right above the active layer and at the growth interface is deteriorated due to the C-doped InGaAlAs layer which is grown at the low temperature and the low V/III ratio and the growth interruption, resulting in an increased threshold current value.

SUMMARY OF THE INVENTION

The present invention is directed to reduce the deterioration of crystallinity in the vicinity of the active layer when doping C which is the p-type dopant, and to suppress the diffusion of Zn which is the p-type dopant to the undoped active layer, so as to realize a steep doping profile. With these effects, in the laser device structure, it is possible to reduce the device resistance while suppressing the increase of a threshold value current.

Figure 6:
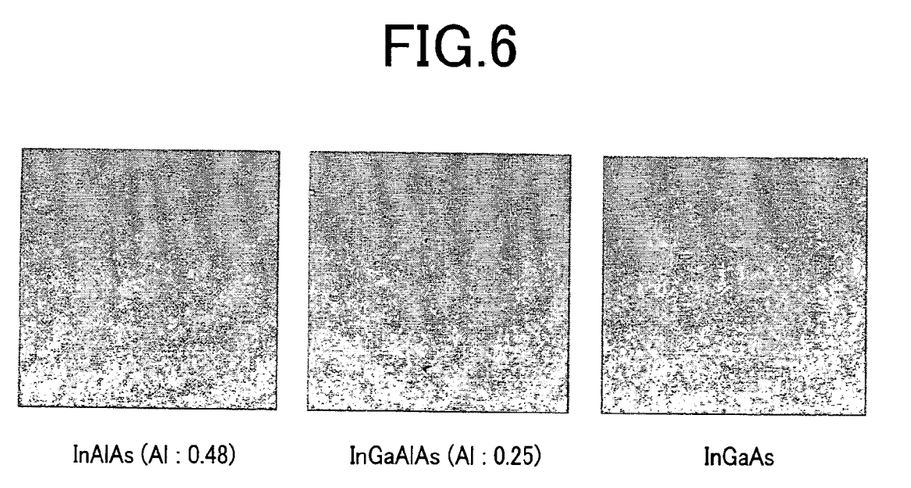
FIG. 6 is a surface photograph of a growth interruption layer.
Figure 15:
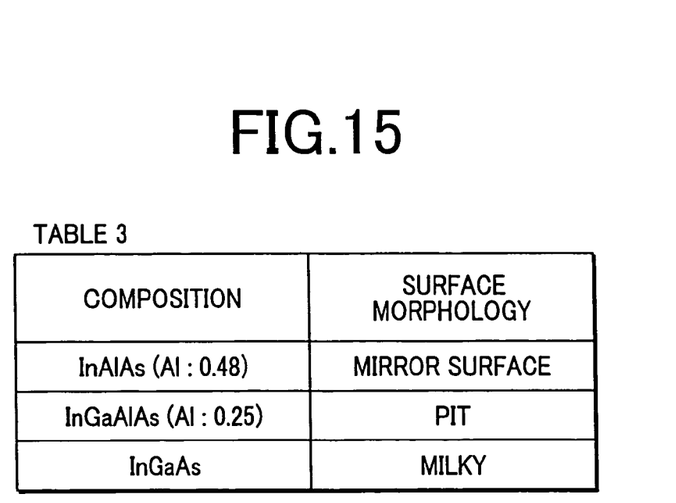
FIG. 15 is a table showing the summary of surface morphology of a growth interruption layer.

When a Zn-doped InGaAlAs layer having favorable crystallinity is formed between a C-doped InGaAlAs upper-side guiding layer and an undoped active layer, the influence of the C-doped InGaAlAs layer whose crystallinity is lowered can be reduced, in the vicinity of the active layer. Further, the diffusion of Zn from the Zn-doped InP cladding layer can be suppressed by the C-doped InGaAlAs layer. Further, as a result of studying the composition of the InGaAlAs and the deterioration of crystallinity during growth interruption, the C-doped layer is formed in the InGaAlAs composition with a small deterioration of crystallinity. FIG. 6 is a surface photograph during the growth interruption and FIG. 15 shows the summary of surface morphology. In the study, the InGaAlAs layer is grown on the InP substrate and the growth interruption is performed. While a surface of InAlAs having the large Al composition (Al: 0.48) forms a mirror surface, a surface of InGaAlAs having the small Al(aluminium) composition (Al: 0.25) forms pits therein. Hence, the surface of InGaAs is milky. The surface morphology has a tendency to become a mirror surface along with the increase of the Al composition.

By performing the growth interruption in the InAlAs composition or in the InGaAlAs composition close to the InAlAs composition, the deterioration of the crystallinity can be reduced. Thus, with the Zn-doped InGaAlAs layer formed on the active layer, and the C-doped InGaAlAs layer with lowered crystallinity separated from the active layer, it is possible to reduce the influence of loss of the crystallinity. Further, it is possible to reduce the occurrence of defects due to the growth interruption by providing the growth interruption by the C-doped layer to the inside of the InGaAlAs layer or the InAlAs layer which contains the large Al composition.

According to the present invention, it is possible to achieve both of the reduction of the deterioration of crystallinity in the vicinity of the active layer due to C doping and the reduction of Zn diffusion from the cladding layer to the active layer. This improves a manufacturing yield rate, reduces a threshold current value, and increases an optical output.

DETAILED DESCRIPTION OF THE PREFERRED EMBODIMENTS

Embodiments of the present invention will be explained in detail with reference to accompanying drawings.

Embodiment 1

Figure 7:
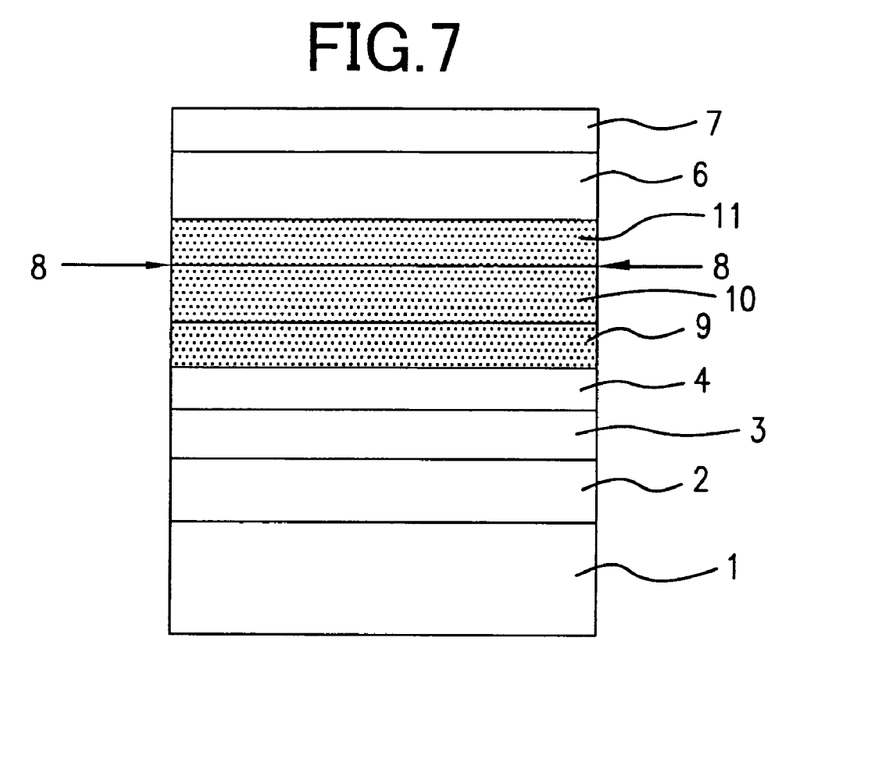
FIG. 7 is a schematic view showing the cross-sectional structure of the semiconductor multi-layered film which shows a first embodiment of the present invention.

FIG. 7 shows the cross-sectional structure of the present invention. The following layers are successively grown on an n-InP. substrate 1 by metalorganic vapor phase epitaxy: an n-InP cladding layer 2, an n-InGaAlAs lower-side guiding layer 3, an undoped InGaAlAs multiple quantum well active layer 4, a Zn-doped InGaAlAs upper-side guiding layer 9, a Zn-doped InGaAlAs composition gradient layer (an InGaAlAs layer to an InAlAs layer) 10, a C-doped InAlAs cladding layer (C: 1 to $5 \times 10^{18}$ cm$^{-3}$) 11, a Zn-doped InP cladding layer (Zn: $1 \times 10^{18}$ cm$^{-3}$) 6, and a Zn-doped InGaAs contact layer 7 (Zn: $2 \times 10^{18}$ cm$^{-3}$). The layers up to the Zn-doped InGaAlAs upper-side guiding layer 9 are continuously grown at a growth temperature of 690° C. Then, since it is necessary to lower the growth temperature to 570° C. prior to the growth of the C-doped InAlAs cladding layer 11, the growth interruption 8 is provided. After the growth temperature is stabilized, the C-doped InAlAs cladding layer 11 is grown. Further, the growth interruption is provided to increase the growth temperature to the vicinity of 600° C. which is the growth temperature for the Imp-based compounds. Then, the Zn-doped InP cladding layer 6 and the Zn-doped InGaAs layer 7 are grown. Here, the concentration of C doping falls within a range from $5 \times 10^{17}$ to $5 \times 10^{18}$ cm$^{-3}$, and more preferably falls within a range from $1 \times 10^{18}$ to $5 \times 10^{18}$ cm$^{-3}$.

Further, with respect to raw materials for growing the layers, trimethylaluminum (TMA), trimethylindium (TMI), triethylgallium (TEG), phosphine (PH$_3$) and arsine (AsH$_3$) are mainly used. Disilane (Si$_2$H$_6$) is used as an n-type dopant raw material, and dimethylzinc (DMZ) or carbon tetrabromide (CBr$_4$) is used as a p-type dopant raw material. With respect to the structure, the Zn-doped InGaAlAs guiding layer having the favorable crystallinity can be formed on the undoped InGaAlAs multiple quantum well active layer, and the growth interruption can be provided above the Zn-doped InGaAlAs layer. Thus, it is possible to reduce the occurrence of defects and the influence of loss of crystallinity can be reduced. Further, due to the presence of the C-doped InAlAs cladding layer 11, it is possible to suppress the diffusion of Zn from the Zn-doped InP cladding layer 6 and the Zn-doped InGaAs contact layer 7. Accordingly, with use of the present invention, it is possible to reduce the Zn diffusion to the active layer and, compared to the structure which adopts only Zn-doped layers, the manufacturing yield rate of the devices can be improved by approximately 30%. Further, compared with a case where all layers on the active layer ranging from the InGaAlAs guiding layer to the InAlAs cladding layer are formed of a C-doped layer, reduction of the influence due to the deterioration of crystallinity, approximately 1.2 mA reduction of a threshold current value of the device, and 20% reduction of the maximum optical output can be realized. In the present invention, the C-doped layer is formed in the InAlAs layer. The C-doped layer, however, may be formed from the InGaAlAs composition gradient layer. Further, although the InGaAlAs layer is formed as the composition gradient layer, the InGaAlAs layer may be formed of a multi-stage InGaAlAs layer. Although the InGaAs contact layer is doped with Zn, a C-doped InGaAs layer may be used. When the C-doped InGaAs layer is used, the Zn diffusion to the active layer can be further reduced so that a film thickness of the C-doped layer is reduced. Accordingly, when the film thickness of the C-doped layer is reduced by half, the threshold current value of the device can be reduced by approximately 2 mA and hence, the maximum optical output can be increased by 25%.

Embodiment 2

Figure 8:
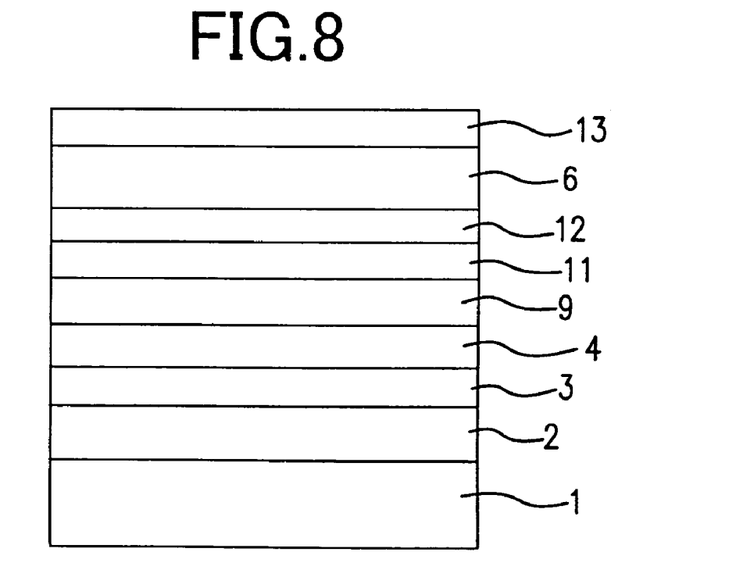
FIG. 8 is a schematic view showing the cross-sectional structure of the semiconductor multi-layered film which shows a second embodiment of the present invention.

FIG. 8 shows an example in which the present invention is applied to a case where the semiconductor optical device includes an upper-side grating layer. When an InGaAsP layer is doped with C, C becomes a p-type dopant in the vicinity of an InGaAs layer and becomes an n-type layer with a low doping concentration (approximately $1\times10^{16}$ cm$^{-3}$) in the vicinity of an InP layer. Further, when the InGaAlAs layer is formed of a grating layer, it is necessary to cope with oxidation of a re-growth interface since the grating layer contains Al. Accordingly, with respect to the device structure, an n-InP cladding layer 2, an n-InGaAlAs lower-side guiding layer 3, an undoped InGaAlAs multiple quantum well active layer 4 and a Zn-doped InGaAlAs upper-side guiding layer 9 are grown on an n-InP substrate 1 in the same manner as the above-mentioned embodiment 1. Thereafter, growth interruption by lowering the temperature, growth of a C-doped InAlAs layer 11, growth interruption by increasing the temperature, and growth of a Zn-doped InGaAsP grating layer 12 are successively performed. Further, a grating shape is formed in the InGaAsP layer by interference exposure, electron beam lithography, dry etching or wet etching. The Zn-doped InP cladding layer 6 is grown again, and a Zn-doped InGaAs contact layer 13 is grown. According to the present invention, it is possible to increase a manufacturing yield rate by 30% by suppressing the Zn diffusion in the same manner as the embodiment 1, compared to the conventional technique in which only Zn doping layers are adopted. Additionally, compared to the case where only C doping layers are adopted, reduction of the influence due to the deterioration of crystallinity, approximately 1.2 mA reduction of a threshold current value of the device, and 20% increase of the maximum optical output can be realized. Although the InGaAsP grating layer is used in the present invention, when the oxidation of the re-growth interface can be eliminated by in-situ etching, an InGaAlAs grating layer may be also used. In this case, the grating layer may be formed of a C-doped InGaAlAs layer.

Embodiment 3

Figure 9:
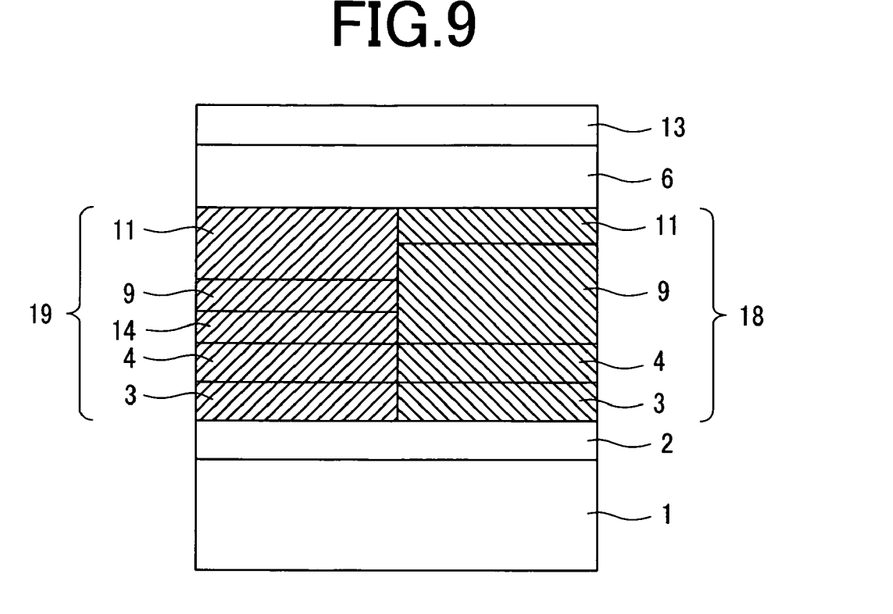
FIG. 9 is a schematic view showing the cross-sectional structure of the semiconductor multi-layered film which shows a third embodiment of the present invention.

FIG. 9 shows a case where the present invention is applied to an integrated light source which is formed by a laser and an electro absorption modulator. In the same manner as the above-mentioned embodiment 1, an n-InP cladding layer 2, an n-InGaAlAs lower-side guiding layer 3, an undoped InGaAlAs multiple quantum well active layer 4, a Zn-doped InGaAlAs upper-side guiding layer 9, a C-doped InAlAs cladding layer 11, and a portion of a Zn-doped InP cladding layer are grown on an n-InP substrate 1, forming a laser part 18. Thereafter, using an oxide as a mask, the structure ranging from the surface layer to the substrate is etched by dry etching or wet etching. An n-InGaAlAs lower-side guiding layer 3, an undoped InGaAlAs multiple quantum well active layer 4, an undoped InGaAlAs layer upper-side guiding layer 14, a Zn-doped InGaAlAs upper-side guiding layer 9, a C-doped InAlAs cladding layer 11, and a portion of an InP cladding layer are formed on the removed portion, forming an EA (electro absorption) modulator part 19. Thereafter, the Zn-doped InP cladding layer 6 is grown again, and a Zn-doped InGaAs contact layer 13 is formed. In the conventional structure using only Zn, the optimum Zn doping profile differs between the EA modulator part and the laser part. The doping concentration of the Zn-doped InP cladding layer is set equal to the doping concentration of the EA modulator part with a low concentration of Zn, whereby the doping concentration of the laser part is low. As a result, the maximum optical output is small. With use of the present invention, the Zn diffusion from the Zn-doped InP cladding layer 6 can be reduced by C-doped InAlAs, and hence it is possible to increase the concentration of Zn in the InP cladding layer also with respect to the modulator part. Accordingly, in the integrated light source formed by the EA modulator and the laser, the maximum optical output can be increased by approximately 20%, compared to the conventional structure using only Zn.

Embodiment 4

Figure 10:
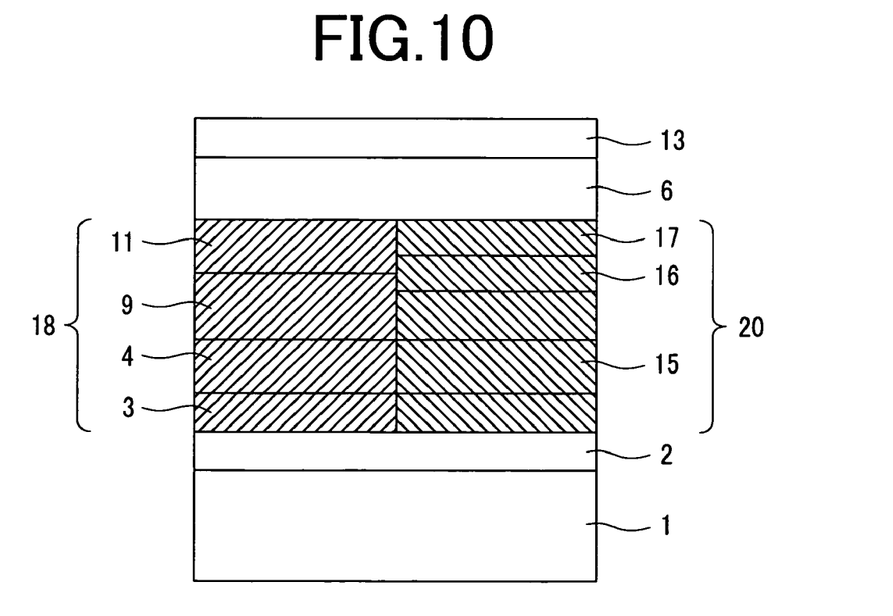
FIG. 10 is a schematic view showing the cross-sectional structure of the semiconductor multi-layered film which shows a fourth embodiment of the present invention.

FIG. 10 shows a case where the present invention is applied to an integrated light source which is formed by a laser and a waveguide. In the same manner as the above-mentioned embodiment 1, an n-InP buffer layer 2, an n-InGaAlAs lower-side guiding layer 3, an undoped InGaAlAs multiple quantum well active layer 4, a Zn-doped InGaAlAs upper-side guiding layer 9, a C-doped InAlAs cladding layer 11, and a portion of an InP cladding layer are grown on an n-InP substrate 1, forming a laser part 18. Thereafter, using an oxide as a mask, the structure ranging from the surface layer to the substrate is etched by dry etching or wet etching. Next, an undoped InGaAsP layer 15, a Zn-doped InAlAs layer 16, a C-doped InAlAs layer 17 and a portion of an InP cladding layer are grown on the removed portion, forming a waveguide part 20. Thereafter, in the same manner as the above-mentioned embodiments, the Zn-doped InP cladding layer 6 is grown again, and a Zn-doped InGaAs contact layer 13 is grown. The integrated light source which is formed by the laser and the waveguide differs in a desired Zn profile between the laser part and the waveguide part in the same manner as the above-mentioned embodiment 3. That is, it is desirable that the waveguide part is undoped and the laser part is of a p-type up to the vicinity of an active layer. In order to make a doping profile of the waveguide part equal to a doping profile of the laser part, Zn diffuses in the waveguide part. However, with the use of the method of the present invention, it is possible to stop the Zn diffusion to the undoped InGaAsP waveguide layer by the C-doped InAlAs layer. Even when the concentration of Zn in the Zn-doped InP cladding layer 6 of the laser part 18 is increased, the Zn diffusion to the undoped InGaAsP layer 15 of the waveguide part 20 can be suppressed. Accordingly, it is possible to reduce the loss at the waveguide part. Thus, an optical output can be increased by 20% compared with a case where only the Zn doping is performed.

Embodiment 5

Figure 11:
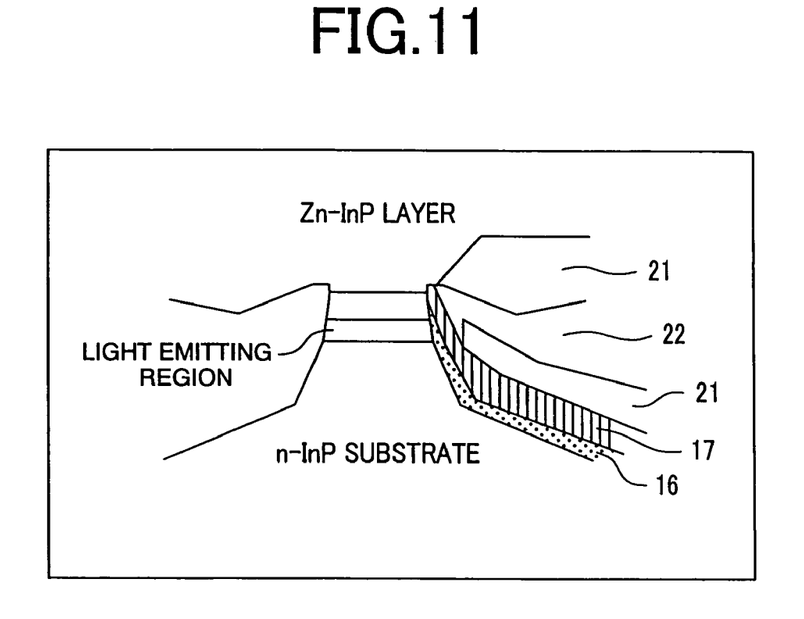
FIG. 11 is a schematic view showing the cross-sectional structure of the semiconductor multi-layered film which shows a fifth embodiment of the present invention.

FIG. 11 shows an example in which the present invention is applied to the buried-type laser structure. In the same manner as the above-mentioned embodiments, the multi-layered structure of a laser is successively grown on an n-InP substrate by metalorganic vapor phase epitaxy. Thereafter, using an oxide as a mask, the multi-layered structure ranging from the surface layer to the substrate is etched by dry etching or wet etching, thus forming a mesa type structure. Further, both sides of the mesa type structure are buried by a p-type InAlAs buried layer 16, an n-type InP layer 21, a p-type Zn-doped InP layer 22 and an n-type InP layer 21. Further, after removing the mask, the Zn-doped InP cladding layer 6 is grown again, and a Zn-doped InGaAs contact layer 13 is grown. According to the present invention, the p-type InAlAs buried layer is formed of the Zn-doped InAlAs layer 16 and the C-doped InAlAs layer 17, and the light emitting layer side is formed of the Zn-doped InAlAs layer 16. With the structure, it is possible to reduce the Zn diffusion from the Zn-doped InP layer to the inside of the mesa type structure, while maintaining the crystallinity of the buried layer at an interface between the mesa type structure and the buried layer and in the vicinity of the mesa type structure. Accordingly, the Zn diffusion to the active layer can be reduced, and a threshold current value can be reduced by approximately 30%, compared to the case where only Zn doping is adopted.

Embodiment 6

Figure 12:
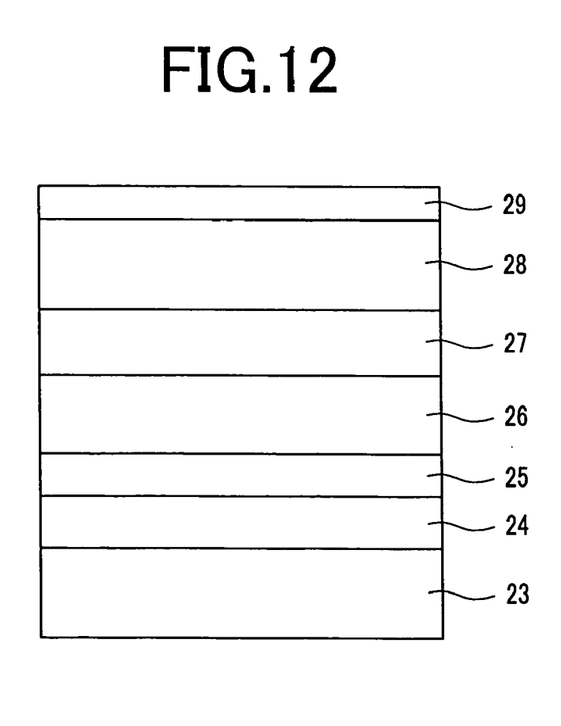
FIG. 12 is a schematic view showing the cross-sectional structure of the semiconductor multi-layered film which shows a sixth embodiment of the present invention.

FIG. 12 shows an example in which the present invention is applied to the laser structure for a GaAs/AlGaAs-system CD(compact disc). An n-GaAs buffer layer 24, an n-AlGaAs cladding layer 25, an AlGaAs/AlGaAs or a GaAs/AlGaAs multiple quantum well active layer 26, a Zn-doped GaAlAs cladding layer 27, a C-doped GaAlAs cladding layer 28, and a Zn-doped GaAs contact layer 29 are successively grown on an n-GaAs substrate 23 by metalorganic vapor phase epitaxy. In the growth conditions of the C-doped AlGaAs, a low temperature and a low V/III ratio are required compared to high-quality AlGaAs. Thus, the crystallinity of the C-doped AlGaAs is slightly lowered. Accordingly, by forming the active layer side using the Zn-doped AlGaAs cladding layer and forming the contact layer side using the C-doped AlGaAs, it is possible to prevent both crystallinity in the vicinity of the active layer from lowering and the Zn diffusion to the active layer from reducing. According to the present invention, it is possible to increase a manufacturing yield rate of the devices by approximately 20%, compared to the case where only Zn doping is adopted. Further, a threshold current value of the device can be lowered by approximately 20%, compared to the case where only C-doping is adopted.

Reference numerals used to identify various structural features in the drawings include the following. 1: n-InP substrate, 2: n-InP cladding layer, 3: n-InGaAlAs lower-side guiding layer, 4: undoped InGaAlAs multiple quantum well active layer, 5: C-doped InGaAlAs upper-side guiding layer, 6: Zn-doped InP cladding layer ($1\times10^{18}$ cm$^{-3}$), 7: Zn-doped InGaAs contact layer, 8: growth interruption, 9: Zn-doped InGaAlAs upper-side guiding layer, 10: Zn-doped InGaAlAs composition gradient layer (InGaAlAs layer to InAlAs layer), 11: C-doped InAlAs cladding layer, 12: Zn-doped InGaAsP grating layer, 13: Zn-doped InGaAs contact layer, 14: undoped InGaAlAs layer, 15: undoped InGaAsP layer, 16: Zn-doped InAlAs layer, 17: C-doped InAlAs layer, 18: laser part, 19: Electro Absorption laser part, 20: waveguide portion, 21: n-InP layer, 22: Zn-InP layer, 23: n-GaAs substrate, 24: n-GaAs buffer layer, 25: n-AlGaAs cladding layer, 26: AlGaAs/GaAlAs or GaAs/AlGaAs multiple quantum well active layer, 27: Zn-doped GaAlAs cladding layer, 28: C-doped GaAlAs cladding layer, 29: Zn-doped GaAs contact layer.

What is claimed is:

1. A method for manufacturing a semiconductor optical device, the method comprising:
    a step of preparing a semiconductor substrate; and
    a step of forming an n-type cladding layer, an undoped active layer, a Zn-doped guide layer, and a C-doped cladding layer on the semiconductor substrate in a sequential order,
    wherein, prior to forming the C-doped cladding layer on the Zn-doped guide layer, film growth is stopped at a location spaced from an interface between the active layer and the guide layer to decrease a film growing temperature from a temperature used to form the Zn-doped guide layer to a temperature used to form the C-doped cladding layer.

2. The method for manufacturing a semiconductor optical device according to claim 1, wherein the semiconductor substrate is comprised of GaAs, the n-type cladding layer is comprised of AlGaAs, and the active layer is comprised of AlGaAs/AlGaAs or GaAs/AlGaAs, and wherein the C-doped layer and the Zn-doped layer are both included in a p-type cladding layer and are both comprised of GaAlAs.

3. The method for manufacturing a semiconductor optical device according to claim 1, wherein the C-doped cladding layer is included in a p-type cladding layer and wherein a concentration of C which is doped into the C-doped cladding layer included in the p-type cladding layer falls within a range of from $5\times10^{17}$ to $5\times10^{18}$ cm$^{-3}$.

4. The method for manufacturing a semiconductor optical device according to claim 1, wherein the film growth is stopped after the growth of the Zn-doped guide layer and prior to the forming of the C-doped cladding layer.

5. A method of manufacturing a semiconductor optical device according to claim 4, wherein the film growth is stopped in a Zn-doped composition gradient layer formed between the Zn-doped guide layer and the C-doped cladding layer.

* * * * *